United States Patent [19]
Kendall et al.

[11] Patent Number: 4,736,275
[45] Date of Patent: Apr. 5, 1988

[54] CIRCUIT BOARD CONTACT GUIDE PATTERN

[75] Inventors: Jerry A. Kendall, Lewisville; Gary L. Morse, The Colony; David M. Webb, Lewisville, all of Tex.

[73] Assignee: Augat Inc., Mansfield, Mass.

[21] Appl. No.: 12,588

[22] Filed: Feb. 9, 1987

[51] Int. Cl.[4] ............................................. H05K 1/11
[52] U.S. Cl. ................................... 361/403; 174/68.5; 361/404; 361/409; 361/420; 361/414
[58] Field of Search ............... 361/413, 420, 404, 406, 361/409, 414, 412, 403; 174/68.5

[56] References Cited

U.S. PATENT DOCUMENTS

| | | | |
|---|---|---|---|
| 3,033,914 | 5/1962 | Acosta-Lleras | 361/409 X |
| 3,340,440 | 9/1967 | Minter | 361/413 X |
| 3,399,372 | 8/1968 | Uberbacher | 339/14 R |
| 3,505,570 | 4/1970 | Spude et al. | 174/68.5 X |
| 3,838,317 | 9/1974 | Coyne | 361/409 X |
| 4,054,742 | 10/1977 | Bonhomme | 361/413 X |
| 4,193,108 | 3/1980 | Romano | 361/413 X |
| 4,303,291 | 12/1981 | Dines | 174/68.5 X |
| 4,560,962 | 12/1985 | Barrow | 174/68.5 X |
| 4,613,924 | 9/1986 | Brault | 361/414 X |

OTHER PUBLICATIONS

L. R. Henning, Double-Entry Cable Card, IBM Tech. Disc. Bull., v. 13, #2, Jul. 1970, pp. 328, 329.

Primary Examiner—R. R. Kucia
Attorney, Agent, or Firm—Weingarten, Schurgin, Gagnebin & Hayes

[57] ABSTRACT

A circuit pattern on the surface of a printed circuit board is used as a guide and connection circuit for closely spaced contacts of a connector to be connected to the circuit board. The contacts of the connector are closely spaced and possibly would not contact the connection pads or might be located between connection pads because of the close spacing of the contacts. The guides formed from circuit patterns accurately guide the connector to the connector pads on the circuit board and place each contact over its respective circuit connection pad.

18 Claims, 4 Drawing Sheets

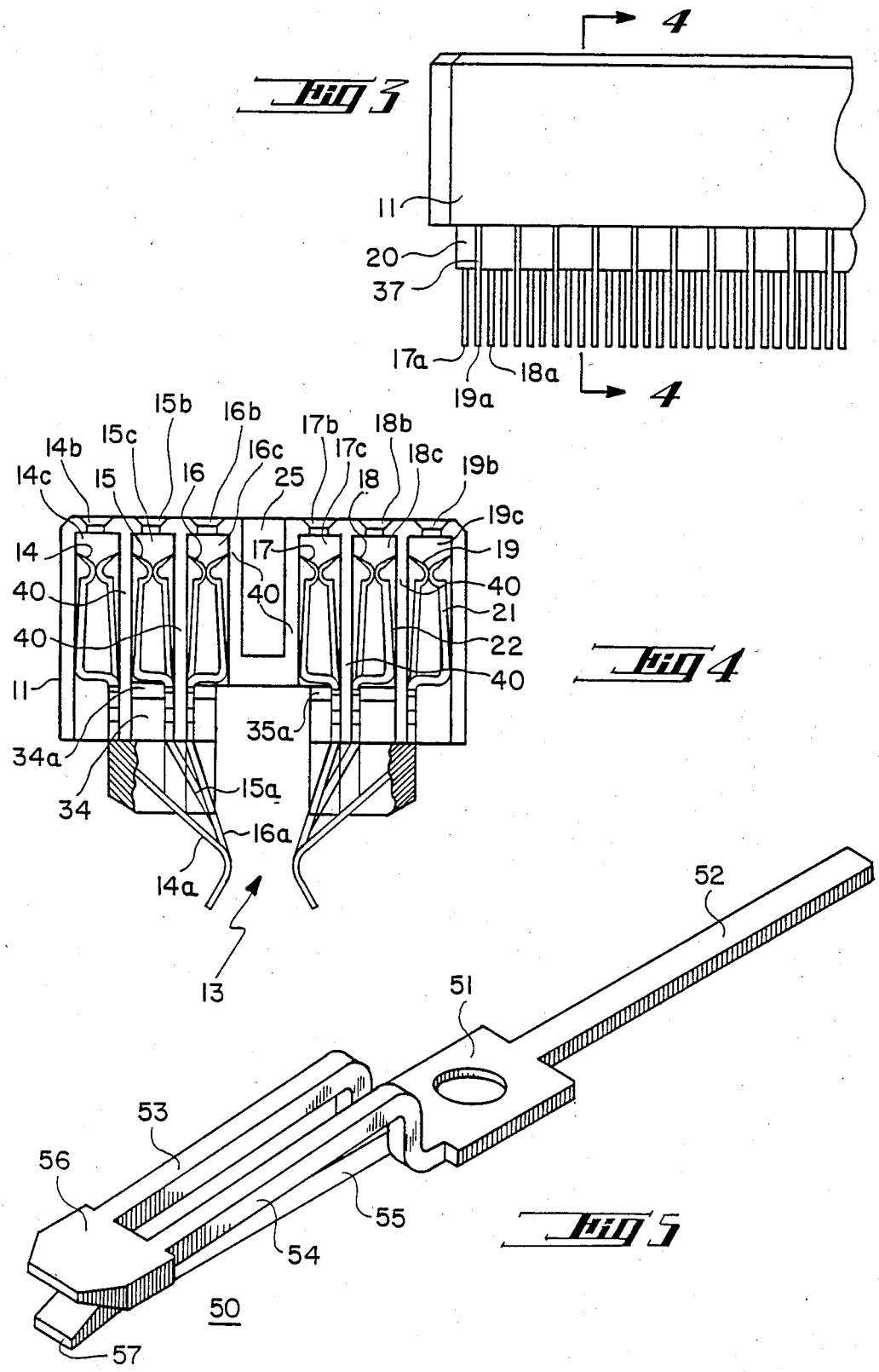

U.S. Patent  Apr. 5, 1988  Sheet 3 of 4  4,736,275
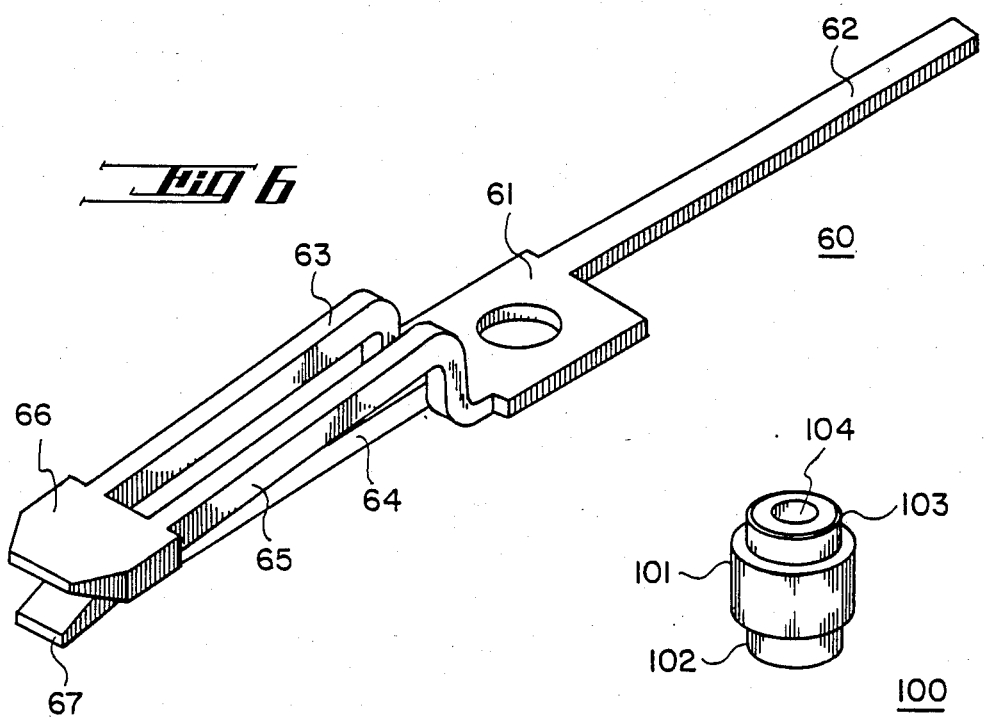
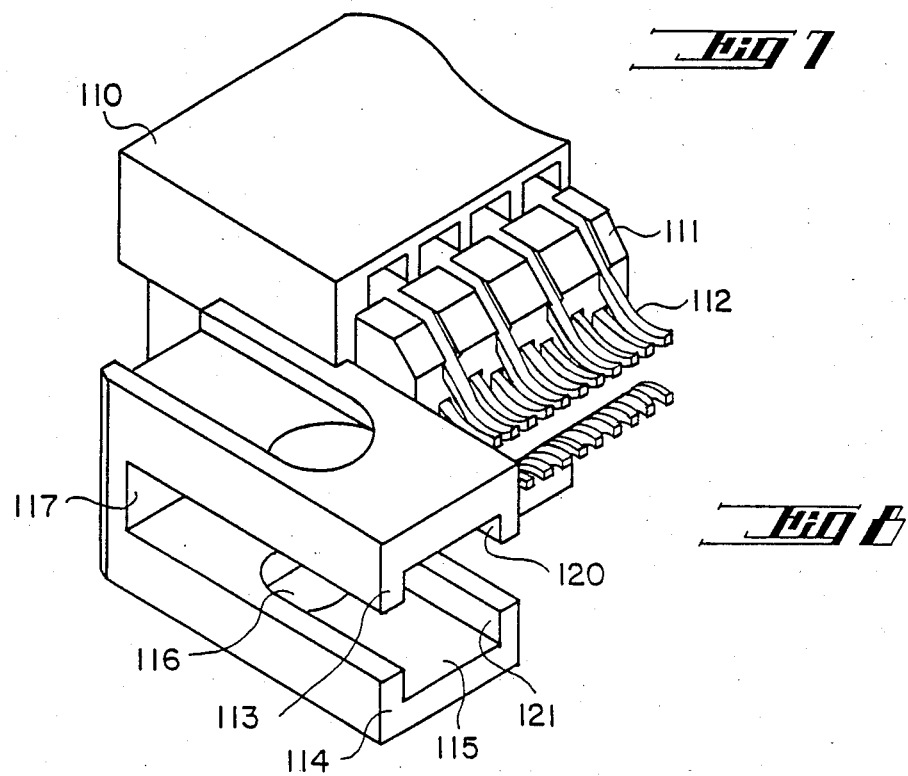

CIRCUIT BOARD CONTACT GUIDE PATTERN

BACKGROUND OF THE INVENTION

This invention relates to connectors and printed circuit boards connected thereto and more particularly to a circuit pattern for guiding connector contacts to connection pads on the printed circuit board.

The printed circuit patterns on circuit boards are used in interconnect the components on the circuit board and to provide connection at the edge of the circuit board to connect the board to connectors and cables attached to the circuit board. Uniform patterns at the edges of the circuit board are formed to connect to connectors with uniformly spaced terminals. The uniform patterns may be configured to connect to surface mount connectors, or to terminals on the connector that are inserted into mounting/contact holes that extend through the circuit board.

SUMMARY OF THE INVENTION

According to a preferred embodiment of the invention, a circuit pattern is configured to guide connector terminals to a row of closely space row of connector pads for connection to high density connections on the edge of a circuit board. The connector terminals are surface mounted on circuit patterns on two sides of the circuit board.

The connector has a plurality of rows of contacts extending out one side of the connector housing and terminating in two rows. For example, in one embodiment, six rows of terminals extend along the length of the connector, with the ends of the contacts in three rows terminating in a single row of contacts, the contact ends being spaced at intervals one-third the spacing between the contacts in the connector. The other three rows of contacts of the six rows also terminate in a single row apart from the first single row with identical spacing to the first row.

Since the contact ends are spaced apart one-third the distance of the contact spacing in the connector, the ends are very close to each other, and to correctly space the contact ends and maintain proper spacing, two spacing blocks are inserted in the underside of the connector housing. A high density connector that may be connected to the circuit pattern of the invention has six rows that are configured in two groups of three rows each. The two groups are separated by slots or openings in the top of the connector housing. The openings are to allow for expansion of the material in the housing and to provide a place for a ground bus, if desired. In another configuration, the space between the two groups of three rows could be used for a seventh row.

BRIEF DESCRIPTION OF THE DRAWINGS

FIG. 3 illustrates a side view (in part) of the connector of FIG. 1;

FIG. 4 is a cross section of the connector taken through 4—4 of FIG. 3;

FIG. 5 illustrates one of the contact types used in the connector of FIG. 1;

FIG. 6 illustrates a second contact type used in the connector;

FIG. 7 illustrates a guide and mounting pin for aiding the positioning of the connector of FIG. 1 on the circuit board;

FIG. 8 illustrates the connector of FIG. 1 with a mounting and guide cap that is formed on the ends of the connector;

DETAILED DESCRIPTION OF THE INVENTION

Figure 1:
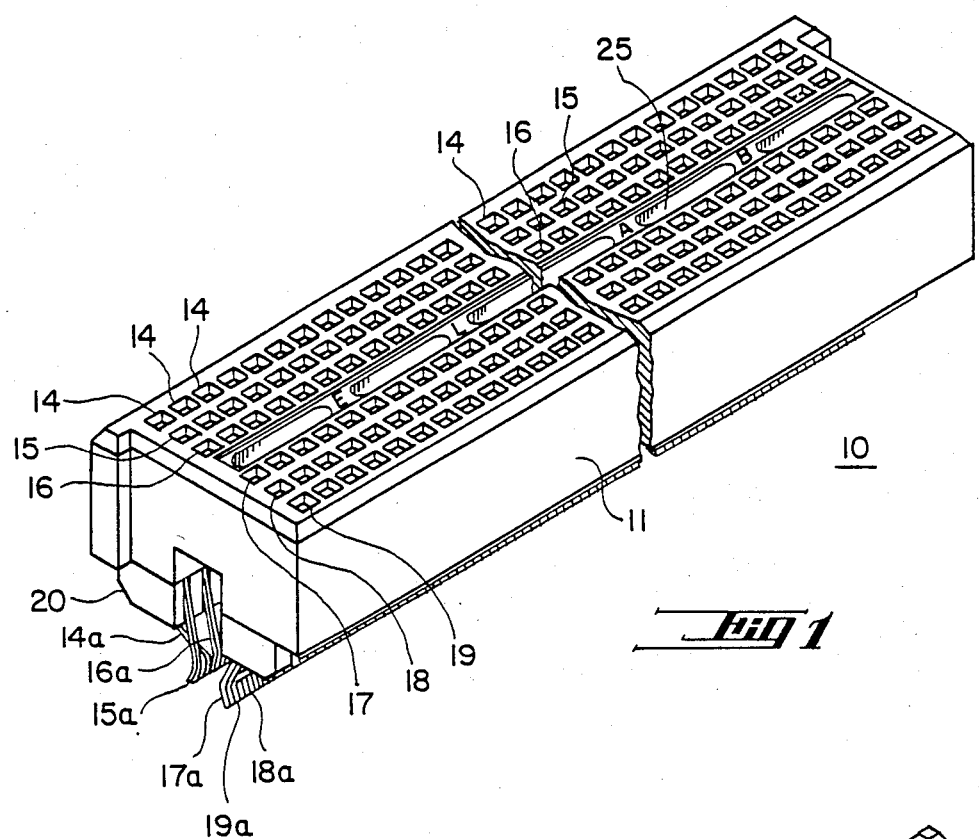
FIG. 1 is a pictorial view of a connector that may be connected to the present invention.
Figure 2:
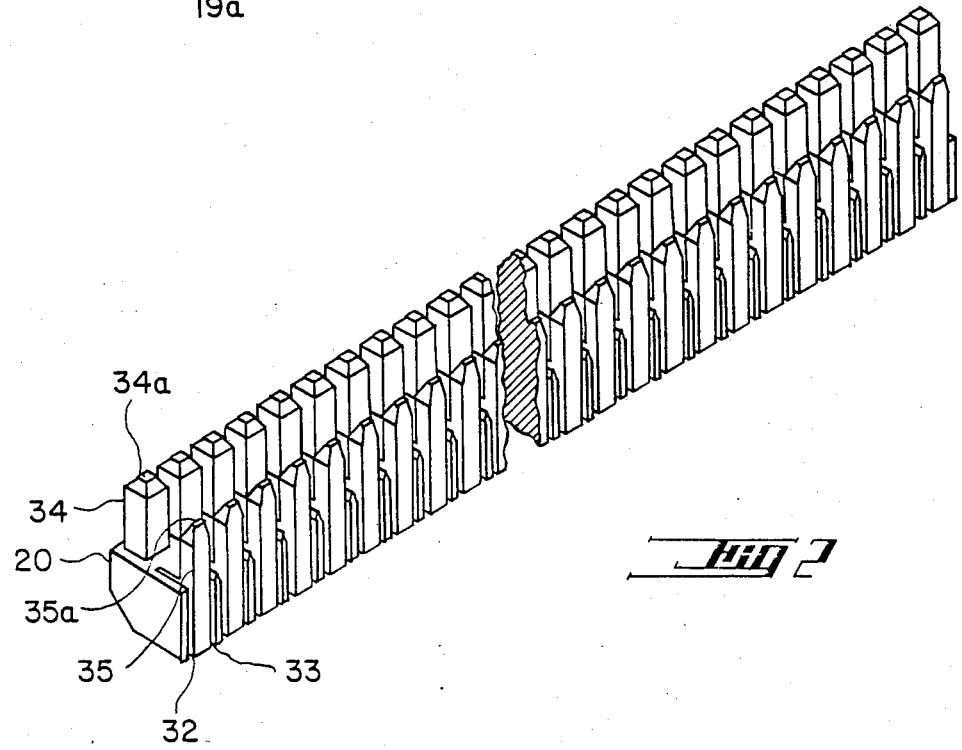
FIG. 2 illustrates a spacing block used to accurately space the ends of the contacts of the connector.

FIG. 1 illustrates one embodiment of a connector that may be used with the present invention. The connector illustrated is a six row box type connector that is mounted on the edge of a printed circuit board with two rows of contacts surface mounted on the opposite sides of the circuit board. Connector 10 has six rows of contacts 14, 15, 16, 17, 18 and 19. Contact ends 14a, 15a, and 16a for rows 14, 15 and 16 are in line and form a single row A. Similarly, contact ends 17a, 18a, and 19a for rows 17, 18 and 19 are in line and form a single row B. The two rows A and B are surface mounted on opposite faces of a circuit board (not shown).

The contacts in the connector may be, for example, spaced 0.1 inch in each direction for each three row set. However since the contact ends for each three row set of connectors are formed in a single row, the contact ends have to be spaced at intervals one-third (0.03333 inch) the distance between the contacts in the connector body. For example, the three row set comprising contacts 14, 15 and 16 have the contact ends 14a, 15a and 16a.

In FIG. 1, contact ends 14a are for the contact ends of the outside row 14, contact ends 15a are for the middle row contacts 15 and contact ends 16a are for the inside row of contacts 16. The configuration is similar for the other row set of contacts 17, 18 and 19. Contact ends 17a are for the inside row of contacts 17, contact ends 18a are for the middle row of contacts 18, and contact ends 19a are for the outer row of contacts 19. Connector 10 has a molded insulator 11 which has a series of openings 25 formed in the insulator between the two sets of contact rows. These openings have a twofold purpose. One purpose is to reduce the mass of material used in the insulator and to provide for expansion to minimize distortion or warping of the insulator. Another purpose is to provide an opening for mounting a grounding buss for the connector, if desired. A seventh row of contacts may also be placed in this central region of the connector modifying the structure of the connector.

To provide the proper spacing for the contact ends of the contacts and to ensure the contact ends are held in place prior to mounting of the connector, a spacing block 20 is used. Two spacing blocks 20 are used, one for each three row set of contacts. The spacing blocks are inserted from the under side of the connector with the contact ends inserted in slots in the spacing block. For example, a contact end 15a would be placed in slot 32. A contact end 16a would be placed in slot 33. Slots 32 and 33 are separated by post 35 having an end 35a which is inserted in a matching opening (see FIG. 4) in insulator 11. Contact end 14a extends around the spacing block in slot 37 on the side of the spacing block opposite from spacing slots 32 and 33. Spacing block has a second post 34 with end 34a that extends into insulator 11 (see FIG. 4).

FIG. 3 is a partial side view of an assembled connector 10. Insulator 11 has spacing blocks inserted with the contacts in place. Contact ends 17a, 19a and 18a are shown in line. Contact end 19a, which is the outer contact of the three row set resides in slot 37, slot 37 being on the opposite side of space bar 20 from slots 32 and 33 in which contact ends 17a and 18a reside.

FIG. 4 is a cross sectional view of connector 10 taken as indicated in section 4—4 of FIG. 3. The connector assembly is made up of the insulator 11, two spacing bars 20 and a plurality of contacts arranged in two three row sets for a total of six rows of contacts. The length of the connector is determined by the number of contacts needed.

The contacts are arranged across the connector in the two three row configurations with the opening 25 between the three row sets. When assembled, the connector body 11 and the two spacing bars 20 form a slot 13 into the under side of the connector to provide for inserting a printed circuit board (not illustrated). The contacts are accessed through the top of the connector through the openings 14b through 19b. Each contact is disposed in a cavity in the insulator 11. For example contact 14 is in cavity 14c. Similarly, each contact 15 through 19 is in its respective cavity 15c through 19c. Each cavity is enclosed by walls 40.

The end of each contact of a three row set is formed to position it in line with the other contact ends of that three row set. Each contact is one of two different configurations of contacts.

Contacts 14 and 19 are formed from one of the two configurations of contacts, and contacts 15 through 18 are formed from the second contact configuration. However, contacts 16 and 17 are formed from the same contact configuration as contacts 15 and 18, but are reversed in the sense that the contact ends are bent in a direction opposite from that of contacts 15 and 18 and the contacts are rotated 180 degrees.

The two configurations of contacts are illustrated in FIGS. 5 and 6. The contact 50 illustrated in FIG. 5 is one of the two configurations of contacts. Contact 50 includes a central portion 51, a contact end 52 which is centered at one end of the central portion 51. On the other end there are two opposing arms. One arm is made up of two offset members 53 and 54 which are joined together at their ends with contact end 56. The other arm is a single member 55 having a contact end 57. Contact ends 56 and 57 receive the contact from a mating connector.

The contact in FIG. 6 is the second configuration of contacts. The design is the same as the configuration of FIG. 5 except the contact end 62 extends form one side of the central portion 61 rather than being centrally located as is contact end 52 on contact 50. Contact 60 has the contact arms as does contact 50, one arm made up of two members 63 and 65 ending in contact end 66 and contact arm 64 ending in contact end 67. By rotating contact 60 180 degrees around its longitudinal axis the contact end is effectively placed on the opposite side of the central portion 61. By rotating the contact configuration of FIG. 6, the in line configuration of the contact ends of the contacts in each three row set is achieved by using only two configurations of contacts.

FIG. 7 illustrates a pin 100 used to position the connector of the present invention over the contact pads on the circuit boards and to secure the connector to the printed circuit board. The pin has a central region 101 that is pressed and/or secured in the printed circuit board with the ends 102 and 103 extending out opposite sides of the printed circuit board. FIG. 8 illustrates a connector 110 with a mounting cap on the end. While only one end of the connector is illustrated, there will be a mounting cap on each end of the connector. The mounting cap 117 has parallel parts 113 and 114 separated by the opening 115. When the connector is positioned on a printed circuit board, the parallel parts 113 and 114 are on opposite sides of the circuit board with the board extending into opening 115. The pins 100 are positioned so that when the connector is moved on to the printed circuit board with the board extending into the opening 115, the ends of the pin 102 and 103 move into the opening 115 against the sides 120 and 121 of the mounting cap and stop so that the pin is aligned with the opening 116 of the mounting cap. With use of a pin 100 at each end of the connector, the contact terminals 112, properly positioned by the spacing block 111, are positioned over the contact pattern on the printed circuit board, as illustrated in FIGS. 9 and 10.

After the connector is in place screws may be used to secure the connector in place using opening 104 in pin 100. The opening may be threaded or a screw may extend through the pin 100 and the circuit board.

Figure 9:
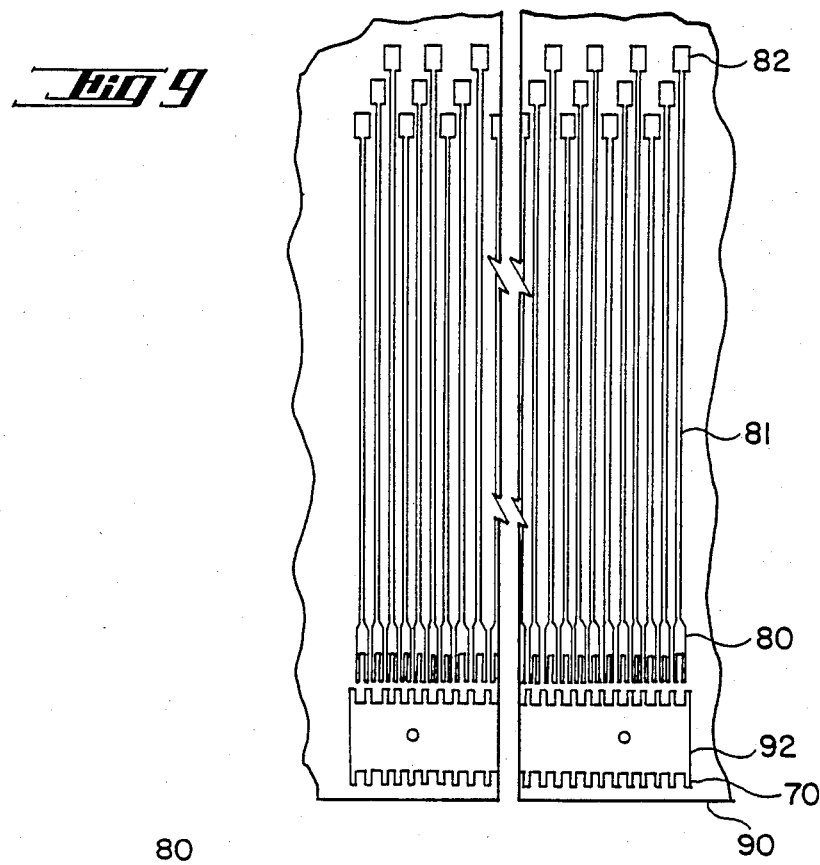
FIG. 9 illustrates a contact pattern of the invention that may used with the connector of FIG. 1.
Figure 10:
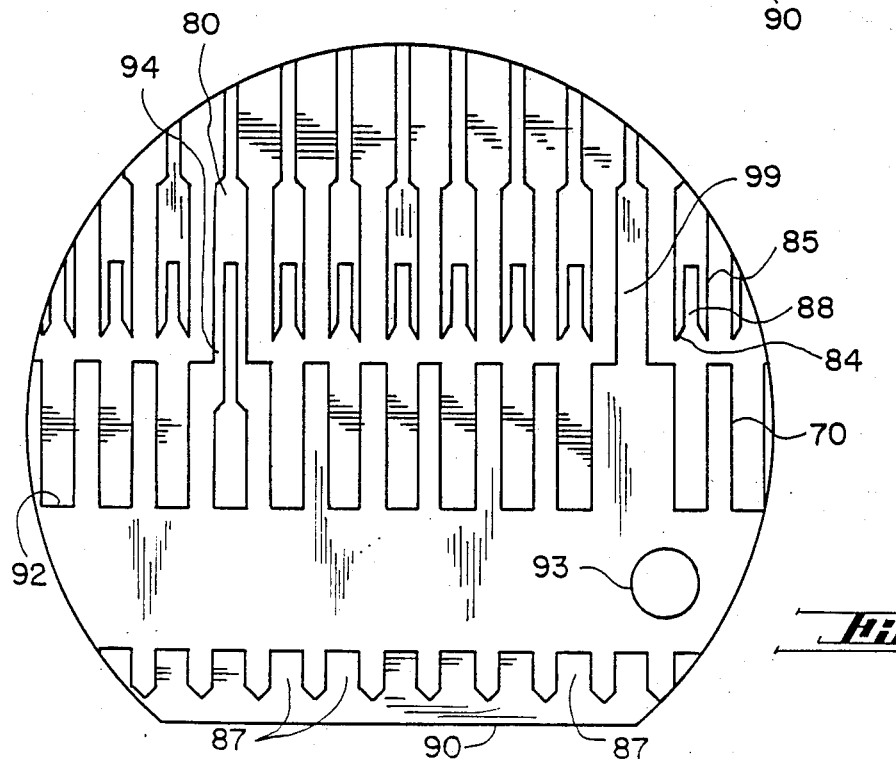
FIG. 10 is a detailed and enlarged view of a part of the contact pattern of FIG. 7.

FIG. 9 is an example of a contact pattern of the present invention on a printed circuit board that may be used with the connector described above, and includes a pattern separate from the contact pattern to guide the contacts of the connector on to contact pads 80 and to accurately position each contact of the connector.

The circuit pattern includes guide patterns 70 and contact pads 80 connected to circuit leads 81 and other connection pads 82.

FIG. 10 illustrates a detailed and enlarged view of the contact guide and contact pad. A plurality of guide patterns 70 extend along and vertical to the edge 90 of the circuit board to which the connector is to be mounted on and connected therewith. The guide patterns 70 form tracks 87 between pairs of guide patterns. As a connector is mounted on the circuit board, each contact end is placed between guide patterns and on the tracks 87. As the connector is moved to position the contact ends of the connector to circuit pads 80, each contact end is guided along its respective track 87 to a position between guides leading to contact pad 80, there being two guides 84 and 85 for each contact. With further movement of the connector, each contact end is moved into track 88 between the contact guides 84 and 85 to engage the contact end with its respective contact pad 80. There is a contact pad and guide pattern on each side of the printed circuit board to facilitate placement of both rows of contacts ends A and B for each connector.

A grounding bar 92 may be used to ground all of the guides 70 and, if a particular contact pad 80 is to be a ground connection, then the contact guides 84 and 85 may be connected to the guides 70 by extensions 94 of the guides 84 and 85. The extension of the guides may be solid as shown by solid guide 99. Ground bar 92 may be connected to other ground circuits or ground planes internal to multilayer circuit boards by a plated through hole 93.

While the invention has been described with reference to a preferred embodiment, it is to be understood that various changes and modifications may be made by those skilled in the art without departing from the spirit and scope of the invention.

What is claimed:

1. A guide and interconnection pattern for a printed circuit board for guiding contacts of a connector along guide paths to contact pads to which the connector contacts are connected, characterized by a plurality of first parallel circuit patterns spaced approximately the width of a connector contact to form a plurality of guide paths, a second plurality of parallel circuit patterns forming second guide paths, and a plurality of contact pads, the first and second parallel circuit patterns aligned such that when a connector is to be mounted on the printed circuit board, the contacts of the connector are placed in the guide paths between the parallel circuit patterns and as the connector is mounted on the printed circuit board, the contacts move along the guide paths to and upon the contact pads.

2. The pattern according to claim 1, characterized in that the second plurality of parallel circuit patterns are connected to respective contact pads.

3. The pattern according to claim 1, characterized in that the first parallel circuit patterns are connected together by a grounding bar.

4. The pattern according to claim 1, characterized in that selected first parallel circuit patterns are connected to selected second parallel circuit patterns.

5. The pattern according to claim 3, characterized in that plated through holes are located at selected locations of the grounding bar to connect with ground planes on the printed circuit board.

6. The pattern according to claim 5 characterized in that the printed circuit board is a multi-layer printed circuit board and that the ground plane is on one of the layers of the printed circuit board other that the layer on which the grounding bar is located.

7. A printed circuit pattern on a printed circuit board for guiding connector contacts to connecting pads on the printed circuit board, characterized by first and second guide patterns and a contact pad, said guide patterns forming guide paths, each guide path extending from one edge of the printed circuit board to a connecting pad, whereby the contacts of a connector are guide to and upon the connecting pad when the connector is mounted on said one edge of the printed circuit board.

8. The circuit pattern according to claim 7, characterized in that second guide patterns are connected to the connecting pads such that each connector contact is guided upon its respective connecting pad between the guide patterns.

9. The circuit pattern according to claim 7, characterized in that selected second guide patterns are connected to selected first guide patterns to form a continuous guide path from the edge of the printed circuit board to the connecting pad.

10. The circuit pattern according to claim 7, characterized in that the circuit pattern is on two sides of the printed circuit board to guide connector terminals to the terminal pads for a connector having surface mount terminals position on each side of the printed circuit board.

11. An etched pattern on a printed circuit board, for use with a connector having closely spaced contact terminals, comprised of a plurality of parallel guides and contact pads, the parallel guides directing said closely spaced connector terminals to and upon the contact pads as the connector is mounted on the edge of the printed circuit board.

12. The pattern according to claim 11, characterized by parallel guides integrally formed with the contact pad.

13. The pattern according to claim 12, characterized by a second plurality of parallel guides extending from one edge of the printed circuit board, in line with, but spaced from said plurality of guides integrally formed with the contact pads.

14. The pattern according to claim 13, characterized in that selected ones of said second plurality of parallel guides are connected to selected ones of said parallel guides integrally formed with the contact pads.

15. The combination of an etched pattern on a printed circuit board and guide pins, for use with a connector having closely spaced contact terminals, comprised of a plurality of parallel guides and contact pads, the parallel guides directing said closely spaced connector terminals to and upon the contact pads as the connector is mounted on the edge of the printed circuit board and the guide pins maintaining the alignment of the connector contacts with the etched pattern on the printed circuit board by preventing lateral movement of the connector and the contacts thereon as the connector is guided onto the printed circuit board.

16. The combination according to claim 15 wherein two guide pins are used and are located on each side of the guide pattern in line with ends of the connector.

17. The combination according to claim 15 wherein the guide pins are mounted through the printed circuit board with opposite ends of the pins extending above the surfaces of the printed circuit board.

18. The pins according to claim 17 wherein the pins have an opening extending through the pin for securing the ends of the connector with a screw or rivet.

* * * * *